United States Patent [19]

Schrock

[11] Patent Number: 5,752,100
[45] Date of Patent: May 12, 1998

[54] DRIVER CIRCUIT FOR A CAMERA AUTOFOCUS LASER DIODE WITH PROVISION FOR FAULT PROTECTION

[75] Inventor: Anthony Ward Schrock, Rochester, N.Y.

[73] Assignee: Eastman Kodak Company, Rochester, N.Y.

[21] Appl. No.: 808,293

[22] Filed: Feb. 28, 1997

Related U.S. Application Data

[63] Continuation of Ser. No. 592,170, Jan. 26, 1996, abandoned.
[51] Int. Cl.[6] .............................. G03B 3/00; G03B 13/36; H02H 3/00
[52] U.S. Cl. .................................. 396/129; 361/103
[58] Field of Search ............ 396/89, 129; 307/125–126; 361/103

[56] References Cited

U.S. PATENT DOCUMENTS

| | | | |
|---|---|---|---|
| 3,442,193 | 5/1969 | Pagel | 95/44 |
| 3,652,894 | 3/1972 | Wupper | 178/5.2 R |
| 4,357,085 | 11/1982 | Niwa et al. | 354/403 |
| 4,462,058 | 7/1984 | Ziegler | 361/62 |
| 4,477,168 | 10/1984 | Hosoe | 354/403 |
| 4,621,292 | 11/1986 | Hirao et al. | 358/227 |
| 4,702,245 | 10/1987 | Schroder et al. | 128/303.1 |
| 4,721,384 | 1/1988 | Dietrich et al. | 354/403 |
| 4,872,080 | 10/1989 | Hentschel et al. | 361/57 |
| 5,073,838 | 12/1991 | Ames | 361/103 |
| 5,140,600 | 8/1992 | Rebhan | 372/25 |
| 5,179,269 | 1/1993 | Horie et al. | 235/455 |
| 5,189,463 | 2/1993 | Capper et al. | 354/403 |
| 5,225,876 | 7/1993 | Lux et al. | 354/403 |
| 5,276,697 | 1/1994 | Davis | 372/38 |
| 5,379,145 | 1/1995 | Nodine | 361/103 |

*Primary Examiner*—Safet Metjahic
*Assistant Examiner*—Michael Dalakis
*Attorney, Agent, or Firm*—Francis H. Boos, Jr.

[57] ABSTRACT

A laser diode current drive control circuit including a drive circuit supplying a modulated laser diode current drive signal, a laser diode drive current source having a switch responsive to the drive circuit for controlling flow of drive current to the laser diode. The control circuit is further provided with one or more fault sensing circuits coupled to the diode current switch and responsive to a fault condition in the operation of the diode that would cause the diode power output to exceed a predetermined maximum safety limit to open the switch thereby terminating the flow of diode drive current. A feedback sensing circuit operating synchronously with the current drive signal is effective to open the switch when a normal feedback control signal is lost. A drive signal sensing circuit is effective to open the switch when integrated power output of the laser diode exceeds a safety related limit value. The fault sensing circuits are integral with the laser drive circuit and operate independently of the separate controller circuits.

5 Claims, 4 Drawing Sheets

DRIVER CIRCUIT FOR A CAMERA AUTOFOCUS LASER DIODE WITH PROVISION FOR FAULT PROTECTION This is a Continuation of application Ser. No. 08/592,170, filed 26 Jan. 1996, now abandoned.

FIELD OF THE INVENTION

This invention relates generally to the field of photographic cameras with active autofocus modules employing laser diodes for generation of an active autoranging beam. More specifically, it relates to laser diode driver circuits for such modules that incorporate fault protection features to avoid projection of laser beams at power levels that exceed appropriate safety criteria.

BACKGROUND OF THE INVENTION

Camera autofocus systems of the active type are known in which an infrared laser diode is employed to project a beam which, when reflected from a subject to be photographed, is used in the autoranging portion of the autofocus system to determine the distance from the camera to the subject. Preferably, the laser beam is modulated ON and OFF in synchronism with ON/OFF modulation of the beam sensor signal processing system to enhance the signal-to-noise characteristics of the autoranging system. It is necessary to ensure that the beam power does not exceed maximum safety levels established by OSHA for exposure to laser beam energy.

Two failure modes that are of concern in the operation of the laser diode are loss of the feedback signal used to control the output power level of the diode and a drive fault condition in which the diode remains in a continuous ON state. The loss of feedback forces the diode to the current limit established by the design of the laser diode drive circuit. While the current limit may be set to never exceed the established safety limit, variations in output over ambient temperature and process variations would dictate the use of an unacceptably low lower level for good signal acquisition during autoranging operation. With a modulated beam drive, it is possible and desirable to set the peak current drive above the maximum power safety limit to achieve good signal acquistion so long as the integrated power output of the diode over the modulation cycle does not exceed the safety limit. In such a situation, either loss of a feedback control signal or a laser drive fault resulting in a laser diode "stuck ON" condition would cause the integrated power to exceed the safety limit.

Camera controllers can be programmed to monitor the output of the laser diode drive circuit and cause a shutdown if a fault condition such as one of those described is sensed. Controllers can be unreliable as monitor devices, particularly in low battery conditions, and it is therefore preferable to employ other fault sensing arrangements to ensure shutdown of the laser diode when a fault condition occurs. When shutting down the operation of a laser diode during a fault condition, it has been typical to apply a current bypass path across the laser diode that has the effect of turning the diode off. Such an arrangement has the drawback that maximum current continues to flow causing an excessive and unnecessary power drain on the battery which is extremely undesirable in a photographic camera.

SUMMARY OF THE INVENTION

In accordance with an aspect of the invention, therefore, there is provided a control circuit for a laser diode of the type used for autoranging function in an autofocus camera, the control circuit having provision for disablement of the diode in the event of a fault in an operating condition of the diode. The control circuit comprises means for supplying an input signal setting an ON/OFF condition of the laser diode, a laser diode current source including a current switch, the laser diode being coupled to the switch, and a laser diode drive circuit coupling the input signal to the switch for controlling opening and closing of the switch to effect flow of drive current to the laser diode when the switch is closed in response to an ON condition of the input signal. The control circuit further includes fault sensing circuit means coupled to the current switch and responsive to a sensed operating fault of the laser diode during a diode ON condition to open the current switch thereby terminating flow of the drive current from the current source.

In accordance with a particular feature of the invention, the driver circuit includes feedback means for generating a feedback signal from the laser diode to an input of the laser diode drive circuit for holding the power output of the laser diode during an ON condition to a predetermined value and the fault sensing circuit means includes feedback signal sensing means responsive to loss of a normal feedback signal for opening the current switch to terminate the laser diode drive current.

In accordance with another feature of the invention, the input signal is modulated ON and OFF at a predetermined normal duty cycle; and the fault sensing circuit means includes drive circuit sensing means responsive to the laser diode drive circuit for opening the current switch to terminate the laser diode drive current from the current source when it is determined that the laser drive circuit is attempting to drive the laser diode at an increased ON time duty cycle resulting in integrated power output from the laser diode exceeding a predetermined limit value.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Figure 1:
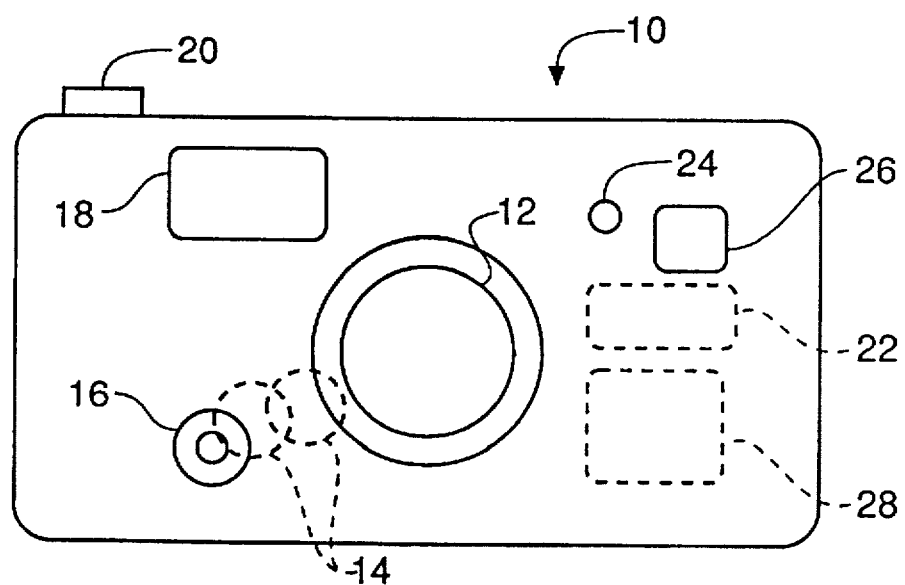
FIG. 1 is a schematic illustration of a camera in accordance with the invention.

Referring to FIG. 1, the camera 10 shown therein includes a taking lens 12 movable axially for focus adjustment by means of a gear train 14 and lens drive motor 16. The camera also includes a viewfinder 18, shutter release button 20. When the shutter release button is partially depressed, an autofocus module, including laser diode control circuit 22, laser diode 24 and reflected beam sensor 26, is activated to determine distance to the subject being photographed. The distance information is calculated in camera controller 28 and the result is used to activate motor 16 and gear train 14 to move lens 12 to the appropriate focus position.

Figure 2:
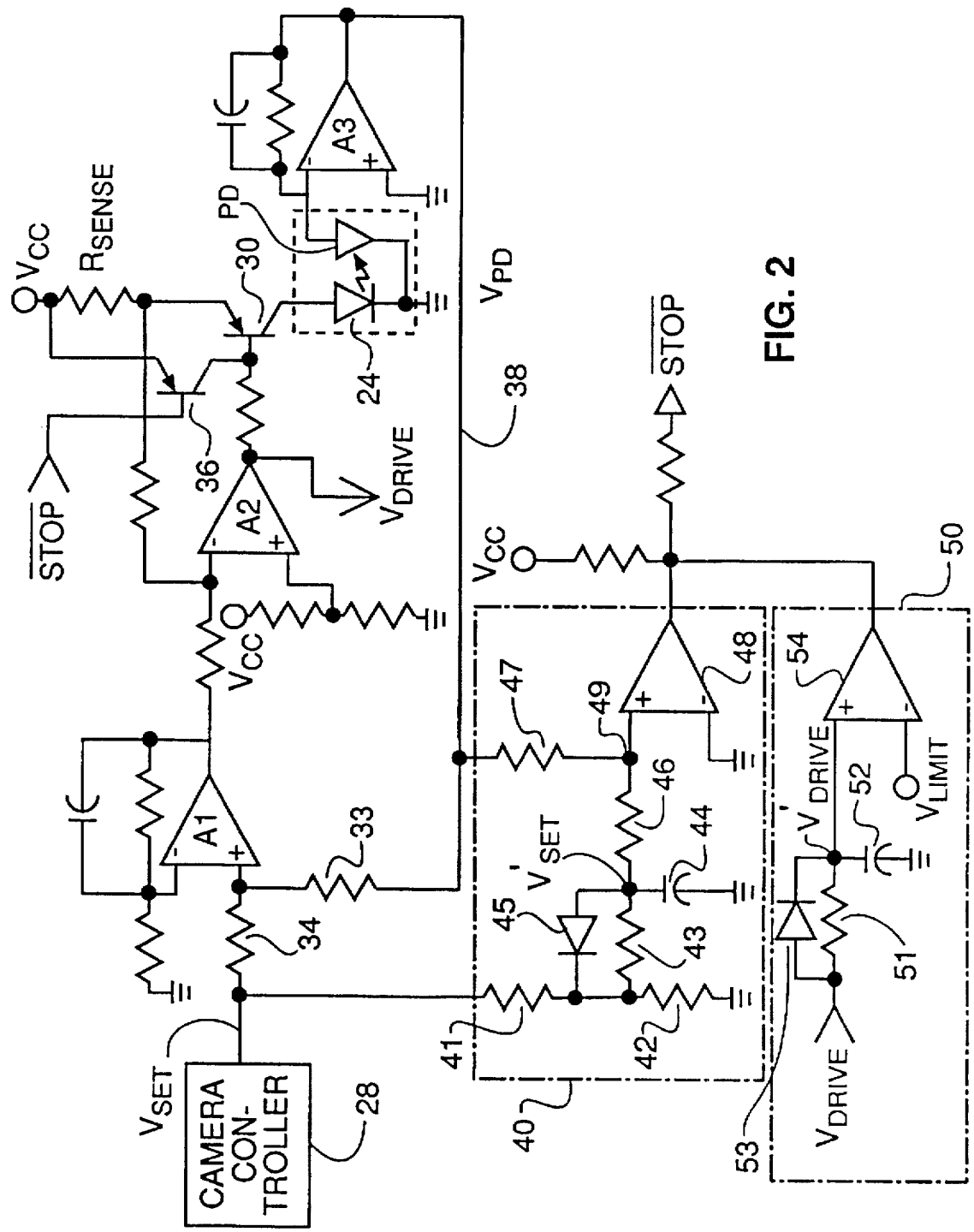
FIG. 2 is a schematic circuit diagram of a laser diode driver circuit embodying the present invention.

FIG. 2 shows a presently preferred form of control circuit 22 incorporating provision for disablement of the laser diode 24 in the event of a fault in an operating condition of the laser diode. An input signal, $V_{SET}$, modulated at a predetermined duty cycle of, for example, 50%, is supplied from camera controller 28 at the beginning of the auto ranging function to set an ON/OFF condition of the laser diode 24. The input signal $V_{SET}$ is combined with a feed back signal $V_{PD}$ at the junction of resistors 33 and 34 and applied to the positive input side of summing amplifier A1. The non-inverted output of amplifier A1 is applied to the negative input side of current driver amplifier A2, the inverted output of which is coupled to the base of current switch transistor 30. Transistor 30, voltage supply $V_{CC}$ and resistor $R_{SENSE}$ comprise a voltage controlled current source for laser diode 24 wherein transistor 30 serves as a current switch normally controlled by the output of driver amplifier A2 to provide drive current to laser diode 24 when the base of transistor 30 is driven low by the signal from amplifier A2. Amplifier A2 serves as a voltage to current convertor with the resistance of $R_{SENSE}$ determining the conversion factor.

The back facet of laser diode 24 is optically coupled to a photodiode sensor PD such that whenever laser diode 24 is ON, photodiode PD generates current. The photodiode PD is connected to the negative input side of a transimpedance amplifier A3 such that the photo induced current of PD is converted to a feedback voltage $V_{PD}$ which is fed back via resistor 33 to be summed with the input signal $V_{SET}$ at the input of summing amplifier A1.

In accordance with the invention, the control circuit includes fault sensing circuit means coupled to the current switch transistor 30 and responsive to a sensed operating fault of the laser diode during a diode ON condition to open the current switch thereby terminating flow of said drive current from the current source $V_{cc}$ and $R_{SENSE}$. The fault sensing circuit means includes one or both of a feedback signal sensing circuit 40 and diode drive sensing circuit 50, either of which is responsive to a sensed operating fault as described below to produce an output signal, $\overline{STOP}$, which is applied to the base of transistor 36. Transistor 36 has its emitter coupled to voltage source $V_{cc}$ and its collector coupled to the base of switch transistor 30. When the $\overline{STOP}$ signal is enabled, i.e. goes low during the occurrence of a fault condition, transistor 36 is driven into conduction pulling the base of switch transistor 30 high. This turns switch transistor 30 off thereby terminating current flow from the current source $V_{cc}$ and $R_{SENSE}$ to laser diode 24. Terminating the laser diode drive current rather than the more conventional technique of shunting the drive current around the diode reduces current drain on the battery which is of particular benefit in the operation of a photographic camera.

In normal operation of the laser control circuit, input signal $V_{SET}$ from resistor 34 is summed with feedback voltage $V_{PD}$ from resistor 33 and the summation is applied to the positive input of summing amplifier A1, the non-inverted output of which is fed to the negative side of current drive amplifier A2. The inverted output of amplifier A2 is coupled to the base of switch transistor 30 to control the current drive to laser diode 24 thereby determining the ON/OFF condition of the laser diode. The level of current drive is set by the values of the voltage source $V_{cc}$ and $R_{SENSE}$. When laser diode is ON, the back facet diode PD conducts causing transimpedance amplifier A3 to convert the diode current in PD into a feedback voltage $V_{PD}$ which is fed back via line 38 to be summed with the input signal $V_{SET}$ at the input of amplifier A1 to maintain the peak value of modulated laser diode drive current at a level below the maximum drive current determined by source $V_{cc}$ and $R_{SENSE}$.

Feedback signal sensing circuit 40 includes an input voltage divider network 41,42 coupled to the input signal $V_{SET}$ supplied from controller 28. The intermediate terminal of the voltage divider network is connected to an RC charging circuit 43,44 to produce a modified signal $V'_{SET}$ which is coupled via summing resistor 46 to the positive input side of comparator 48. A second summing resistor 47 is coupled from the positive input of comparator 48 to the feedback signal line to sum the feedback signal $V_{PD}$ with $V'_{SET}$ at the input to the comparator 48.

Figure 3:
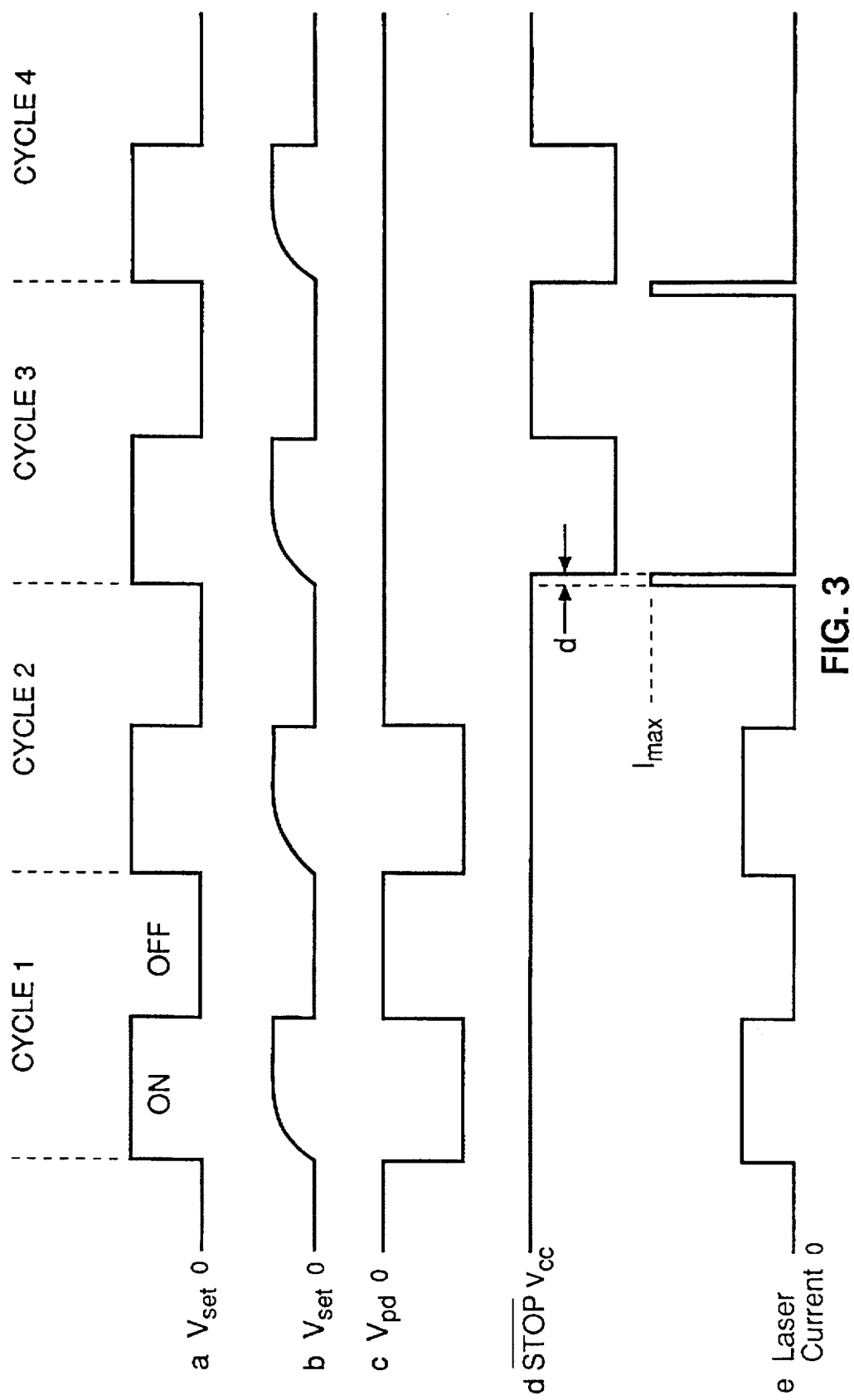
FIG. 3 is a graph of signal waveforms useful in explaining the operation of the circuit of FIG. 2.

The operation of feedback voltage sensing circuit 40 will now be considered with reference to the signal waveforms of FIG. 3. Input signal $V_{SET}$ applied across voltage divider network 41,42 produces a modified signal $V'_{SET}$ with a slow rise determined by the time constant of RC circuit 43,44 and a rapid fall due to the discharge effect of diode 45. This modified input signal is summed with feedback voltage $V_{PD}$ at the positive input of comparator 48. The relative values of voltage divider resistors 41 and 42 are selected so that, in normal operation as shown by cycles 1 and 2, the magnitude of $V'_{SET}$ is less than the magnitude (negative amplitude) of $V_{PD}$ at the summing node 49. The net negative input to the comparator 48 holds the comparator non-conducting, (high output) which, in turn, holds transistor 36 in a non-conducting state (open) allowing switch transistor 30 to remain conducting (closed). The component values of the RC time constant circuit 43,44 are selected to assure that, in normal operation, the magnitude of the positive $V'_{SET}$ signal stays below that of the negative feedback signal during the initial phase of the ON period while the feedback signal stabilizes thereby avoiding any false triggering of the comparator circuit 48. Coupling the input signal $V_{SET}$ to the feedback signal sensing circuit provides proper synchronization for summing with feedback signal $V_{PD}$. Alternatively, a logic high signal, modulated in synchronism with input signal $V_{SET}$, could be supplied directly from controller 28 to achieve the same result.

Cycles 3 and 4 in FIG. 3 represent fault conditions in which there is a loss of feedback signal. Such a loss would customarily cause the laser diode drive current to rise to its maximum amount which would cause the power output from the diode to exceed established safety limit values. However, as seen at the beginning of cycles 3 and 4, the absence of feedback signal allows the voltage at summing node 49 to go positive causing comparator 48 to conduct. When this occurs, the output $\overline{STOP}$ signal is enabled (goes low) which drives transistor 36 into conduction. This pulls the base of switch transistor 30 high, thereby opening the current switch and terminating drive current to the laser diode 24. Comparator circuit 48 conventionally has a hysteresis effect that requires that the voltage to the positive input side of the comparator must rise beyond a threshold positive value above the negative input side (ground) in order for the comparator to begin conducting. As a consequence, there is a slight delay, d, before the $\overline{STOP}$ signal is enabled during which the laser current rises to its maximum value, $I_{max}$; however, the integrated power output over the duty cycle of the laser operation is well below the safety limit threshold.

Figure 4:
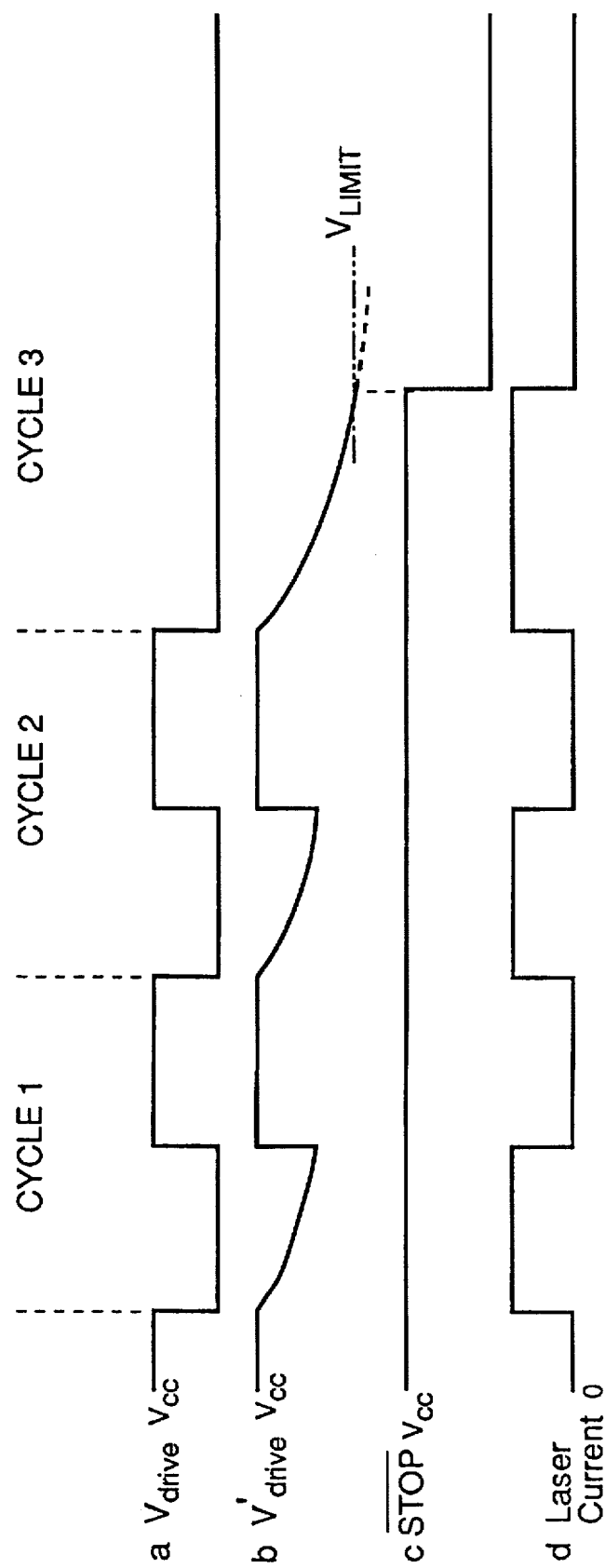
FIG. 4 is another graph of signal waveforms useful in explaining the operation of the circuit of FIG. 2.

Another fault condition that can occur is when the laser diode conducts significantly beyond the normal duty cycle such that the integrated power output exceeds the safety limit threshold. Typically this occurs when a component failure causes the drive signal $V_{DRIVE}$ to remain low, usually in a "stuck ON" state. For this situation, the fault sensing circuit means includes a drive circuit sensing circuit 50 which is responsive to the laser diode drive circuit, in particular to the drive signal, $V_{DRIVE}$, to open the current switch transistor 30 when it is determined that the laser diode is being driven in an increased ON time duty cycle resulting in integrated power output from the laser diode exceeding the safety limit threshold. To this end, drive circuit sensing circuit 50 includes a comparator 54 having its negative input coupled to a voltage reference, $V_{LIMIT}$, that corresponds to the integrated power safety limit threshold for laser diode 24. The signal $V_{DRIVE}$ from amplifier A2 is coupled to an integrating circuit 51,52, to produce a modified signal $V'_{DRIVE}$ which is coupled to the positive input side of comparator 54. Diode 53 is coupled across resistor 51 so that integration occurs only on negative excursions of the signal $V_{DRIVE}$. In operation, with reference to FIG. 4, cycles 1 and 2 again represent normal operating cycles. Signal $V_{DRIVE}$ is coupled to the input of integrator circuit 51,52 producing the integrated voltage signal $V'_{DRIVE}$. The integration time constant of the integrator circuit is set such that, during normal operation, the maximum negative excursion of signal $V'_{DRIVE}$ does not reach the limit value $V_{LIMIT}$ during normal duty cycle ranges of operation. In cycle 3, it is assumed that a failure has occurred causing signal $V_{DRIVE}$ to remain low corresponding to a "stuck ON" condition of laser diode 24. In this condition, signal $V'_{DRIVE}$ continues to integrate down until it crosses the limit value $V_{LIMIT}$ enabling signal $\overline{STOP}$ (low) at the base of transistor 36 to open switch transistor 30 thereby terminating the laser drive current.

It will be appreciated that what has been described is a simple, low cost and effective laser diode control circuit with fail safe protection that directly senses fault conditions in the circuit and interrupts the laser diode drive current rather than shunting the current around the diode, a particular benefit in photographic cameras that normally have limited energy resources. Because the fault sensing circuit means is self contained within the control circuit, there is no reliance on proper operation of a separate controller processor to sense and activate the laser diode shutdown mechanism which is of particular benefit since such controller processors have a tendency to be fault prone to an undesirable degree that makes them less than desirable for safety control purposes.

The invention has been described with reference to a preferred embodiment. However, it will be appreciated that variations and modifications can be effected by a person of ordinary skill in the art without departing from the scope of the invention.

PARTS LIST 10 camera
12 taking lens
14 gear train
16 lens drive motor
18 viewfinder
20 shutter release
22 driver circuit
24 laser diode
26 reflected beam sensor
28 camera controller
30 transistor current switch
33,34 input/feedback summing resistors
36 transistor
38 feedback line
40 feedback voltage sensing circuit
41,42 voltage divider network
43,44 RC time constant circuit
45 discharge diode
46,47 summing resistors
48 comparator
49 summing node
50 laser diode drive sensing circuit
51,52 integrator circuit
53 discharge diode
54 comparator
PD back facet photodiode
A1 summing amplifier
A2 current drive amplifier
A3 transimpedance feedback amplifier

What is claimed is:

1. A control circuit for a laser diode with provision for disablement of the diode in the event of a fault in an operating condition of the diode, comprising:

means for supplying a switching input signal setting an ON/OFF condition of the laser diode in which the laser diode operates at an integrated power level which is at or below a predetermined integrated operating power level but which may have peak power levels exceeding said predetermined integrated operating power level;

a laser diode current source including a current switch, said laser diode being coupled to said switch;

a laser diode drive circuit coupling said input signal to said switch for controlling opening and closing of said switch to effect flow of drive current to said laser diode determined by said switching input signal when said switch is closed in response to an ON condition of the input signal;

fault sensing feedback control circuit means for sensing operating power level of the laser diode and generating a feedback signal to maintain operation of said laser diode at or below said predetermined integrated operating power level; and feedback signal sensing circuit means, separate from said input signal supply means, coupled to said feedback control circuit means and responsive to absence of said feedback signal to open said current switch thereby terminating flow of said drive current from said current source and terminating operation of said laser diode.

2. The control circuit of claim 1 wherein said feedback signal sensing signal means includes a first input terminal coupled to said input signal supply means and a summing network for summing said feedback signal with said input signal to synchronize said feedback signal sensing with an ON condition of the laser diode.

3. The control circuit of claim 2 wherein said summing circuit includes a time constant circuit coupled to said first input terminal and operative during initiation of a laser diode ON condition to provide a short period for stabilization of said feedback signal before allowing said feedback sensing means to effect any control of said current source switch.

4. The control circuit of claim 1 wherein said fault sensing feedback control circuit mans includes a photodiode sensor optically coupled to said laser diode and said feedback sensing circuit means is responsive to output of said photodiode sensor.

5. A photographic camera including an autofocus module including a laser diode for emitting a modulated beam of laser energy during autoranging operation, the camera comprising:

a camera controller including means for supplying a switching input signal setting an ON/OFF condition of the laser diode;

said autofocus module including a laser diode and a laser diode current source, the current source including a current switch, said laser diode being coupled to said switch;

a laser drive circuit responsive to the input signal for determining the ON/OFF condition of the laser diode by controlling the open/closed condition of the current switch, said laser diode driven into an ON condition when said switch is closed;

fault sensing feedback control circuit means for sensing operating power level of the laser diode and generating a feedback signal to maintain operation of said laser diode at or below said predetermined integrated operating power level; and feedback signal sensing circuit means, separate from said input signal supply means, coupled to said feedback control circuit means and responsive to absence of said feedback signal to open said current switch thereby terminating flow of said drive current from said current source and terminating operation of sad laser diode.

* * * * *